US012108545B2

(12) United States Patent
Park et al.

(10) Patent No.: US 12,108,545 B2
(45) Date of Patent: *Oct. 1, 2024

(54) DISPLAY DEVICE AND METHOD OF MANUFACTURING THE SAME

(71) Applicant: Samsung Display Co., Ltd., Yongin-Si (KR)

(72) Inventors: Jeongjin Park, Hwaseong-si (KR); Donghyun Lee, Asan-si (KR); Junyoung Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/380,198

(22) Filed: Oct. 16, 2023

(65) Prior Publication Data
US 2024/0064911 A1 Feb. 22, 2024

Related U.S. Application Data

(63) Continuation of application No. 17/493,910, filed on Oct. 5, 2021, now Pat. No. 11,825,613.

(30) Foreign Application Priority Data

Feb. 15, 2021 (KR) ........................ 10-2021-0020152

(51) Int. Cl.
*H05K 3/46* (2006.01)
*H05K 1/14* (2006.01)

(52) U.S. Cl.
CPC ........... *H05K 3/4679* (2013.01); *H05K 1/144* (2013.01); *H05K 2201/10128* (2013.01); *H05K 2203/104* (2013.01)

(58) Field of Classification Search
CPC .... H05K 1/02; H05K 1/14; H05K 1/141–147; H05K 1/18; H05K 1/181–187; H10K 59/12; H10K 59/1275; H10K 59/131; H10K 71/00; H10K 71/15; G06F 1/16; G06F 3/03; G06F 3/038; G06F 3/041–044
(Continued)

(56) References Cited

U.S. PATENT DOCUMENTS 10,424,964 B2 9/2019 Cho et al.
11,165,272 B2 11/2021 Winkler
(Continued)

FOREIGN PATENT DOCUMENTS

KR 10-2008-0107589 A 12/2008

*Primary Examiner* — Tuan T Dinh
(74) *Attorney, Agent, or Firm* — Innovation Counsel LLP

(57) ABSTRACT

A method includes preparing a substrate including a display area and a non-display area disposed adjacent to the display area, forming first panel magnetic patterns overlapping the non-display area and extending in a first direction on the substrate, forming first film magnetic patterns extending in the first direction on a film, inputting a first magnetism to the first panel magnetic patterns so that the first panel magnetic patterns have a first magnetic property, inputting a second magnetism to the first film magnetic patterns so that the first film magnetic patterns have a second magnetic property, and aligning the film on the substrate so that the first film magnetic patterns overlap the first panel magnetic patterns in a plan view.

18 Claims, 13 Drawing Sheets

(58) Field of Classification Search
USPC .......... 361/749, 760, 767, 782–784, 803
See application file for complete search history.

(56) References Cited

U.S. PATENT DOCUMENTS

| | | | |
|---|---|---|---|
| 2007/0182367 A1* | 8/2007 | Partovi | H02J 50/12 320/108 |
| 2008/0227308 A1* | 9/2008 | Fujii | H05K 1/147 439/66 |
| 2012/0146576 A1 | 6/2012 | Partovi | |
| 2012/0300383 A1 | 11/2012 | Lauder et al. | |
| 2015/0370347 A1 | 12/2015 | Jin et al. | |
| 2016/0079671 A1 | 3/2016 | Yamaguchi et al. | |
| 2017/0120401 A1 | 5/2017 | Fullerton et al. | |
| 2018/0032166 A1* | 2/2018 | Orihara | H01Q 1/52 |
| 2018/0253164 A1* | 9/2018 | Sato | H05K 3/1216 |
| 2019/0050078 A1 | 2/2019 | Hamada et al. | |
| 2019/0057632 A1 | 2/2019 | Kim et al. | |
| 2020/0235169 A1 | 7/2020 | Miyamoto et al. | |
| 2020/0393932 A1* | 12/2020 | Kida | G06F 3/0418 |
| 2020/0393936 A1* | 12/2020 | Bok | H01Q 1/44 |

* cited by examiner

DISPLAY DEVICE AND METHOD OF MANUFACTURING THE SAME

This application is a continuation application of U.S. patent application Ser. No. 17/493,910, filed on Oct. 5, 2021, which claims priority to Korean Patent Application No. 10-2021-0020152, filed on Feb. 15, 2021, and all the benefits accruing therefrom under 35 U.S.C. § 119, the content of which in its entirety is herein incorporated by reference.

BACKGROUND

1. Field

Embodiments of the inventive concept relate generally to a cover film and a display device including the cover film. More particularly, embodiments of the inventive concept relate to a cover film that may shield electromagnetic interference noise.

2. Description of the Related Art

A display device includes a display panel that includes a substrate and a film. For example, the film is a flexible printed circuit board ("FPCB"). The display panel receives signals and/or voltages from drivers disposed on the film.

The display panel is electrically connected to the film through the substrate. In detail, pads (e.g., data pads) formed on the substrate contact pads (e.g., film pads) formed under the film, and the data pads are connected to the display panel. Accordingly, the film pads and the data pads need to properly contact each other.

Recently, as a resolution of the display device increases, a degree of integration of the data pads increases. As the degree of integration of the data pads increases, the film needs to be precisely aligned on the substrate. In other words, the alignment accuracy of the film needs to be improved.

SUMMARY

Embodiments provide a display device.

Embodiments provide a method of manufacturing the display device.

A method of manufacturing a display device may include preparing a substrate including a display area and a non-display area disposed adjacent to the display area, forming first panel magnetic patterns overlapping the non-display area and extending in a first direction on the substrate, forming first film magnetic patterns extending in the first direction on a film, inputting a first magnetism to the first panel magnetic patterns so that the first panel magnetic patterns have a first magnetic property, inputting a second magnetism to the first film magnetic patterns so that the first film magnetic patterns have a second magnetic property, and aligning the film on the substrate so that the first film magnetic patterns overlap the first panel magnetic patterns in a plan view.

In an embodiment, the method may further include forming second panel magnetic patterns extending in the first direction and disposed between the first panel magnetic patterns and forming second film magnetic patterns extending in the first direction and disposed between the first film magnetic patterns.

In an embodiment, the first panel magnetic patterns and the second panel magnetic patterns may be alternatingly disposed.

In an embodiment, the first film magnetic patterns may be formed to correspond to the first panel magnetic patterns, and the second film magnetic patterns may be formed to correspond to the second panel magnetic patterns.

In an embodiment, the method may further include inputting the second magnetism to the second panel magnetic patterns so that the second panel magnetic patterns have the second magnetic property, inputting the first magnetism to the second film magnetic patterns so that the second film magnetic patterns have the first magnetic property, and aligning the film on the substrate so that the second film magnetic patterns overlap the second panel magnetic patterns in a plan view.

In an embodiment, the method may further include inputting the first magnetism to a first panel magnetic input connected to the first panel magnetic patterns and inputting the second magnetism to a first film magnetic input connected to the first film magnetic patterns.

In an embodiment, the method may further include forming second panel magnetic patterns extending in the first direction and disposed between the first panel magnetic patterns, forming second film magnetic patterns extending in the first direction and disposed between the first film magnetic patterns, inputting the second magnetism to a second panel magnetic input connected to the second panel magnetic patterns, and inputting the first magnetism to a second film magnetic input connected to the second film magnetic patterns.

In an embodiment, the method may further include forming third panel magnetic patterns extending in a second direction intersecting the first direction on the substrate, forming third film magnetic patterns extending in the second direction on the film, inputting the first magnetism to the third panel magnetic patterns so that the third panel magnetic patterns have the first magnetic property, inputting the second magnetism to the third film magnetic patterns so that the third film magnetic patterns have the second magnetic property, and aligning the film on the substrate so that the third film magnetic patterns overlap the third panel magnetic patterns in a plan view.

In an embodiment, the method may further include forming fourth panel magnetic patterns extending in the second direction and disposed between the third panel magnetic patterns and forming fourth film magnetic patterns extending in the second direction and disposed between the third film magnetic patterns.

In an embodiment, the third panel magnetic patterns and the fourth panel magnetic patterns may be alternatingly disposed.

In an embodiment, the third film magnetic patterns may be formed in areas to correspond to the third panel magnetic patterns in a plan view and the fourth film magnetic patterns may be formed to correspond to the fourth panel magnetic patterns.

In an embodiment, the method may further include inputting the second magnetism to the fourth panel magnetic patterns so that the fourth panel magnetic patterns have the second magnetic property, inputting the first magnetism to the fourth film magnetic patterns so that the fourth film magnetic patterns have the first magnetic property, and aligning the film on the substrate so that the fourth film magnetic patterns overlap the fourth panel magnetic patterns in a plan view.

In an embodiment, the method may further include inputting the first magnetism to a first panel magnetic input connected to the first panel magnetic patterns and the third panel magnetic patterns and inputting the second magnetism to a first film magnetic input connected to the first film magnetic patterns and the third film magnetic patterns.

In an embodiment, the method may further include forming fourth panel magnetic patterns extending in the second direction and disposed between the third panel magnetic patterns, forming fourth film magnetic patterns extending in the second direction and disposed between the third film magnetic patterns, inputting the second magnetism to a second panel magnetic input connected to the second panel magnetic patterns and the fourth panel magnetic patterns, and inputting the first magnetism to a second film magnetic input connected to the second film magnetic patterns and the fourth film magnetic patterns.

In an embodiment, the method may further include forming a conductor including a first end and a second end on the substrate, forming a test current input in an area to correspond to the first end on the film, and forming a test current output spaced apart from the test current input on the film in an area to correspond to the second end. When the first film magnetic patterns contact the first panel magnetic patterns, the test current input may contact the first end, and the test current output may contact the second end. A test current flows from the test current input to the test current output through the conductor.

In an embodiment, the inputting the first magnetism to the first panel magnetic patterns may include inputting the first magnetism to some of the first panel magnetic patterns among the first panel magnetic patterns, and the inputting the second magnetism to the first film magnetic patterns may include inputting the second magnetism to some of the first film magnetic patterns among the first film magnetic patterns.

In an embodiment, first panel magnetic patterns may be connected to each other, and the first film magnetic patterns may be connected to each other.

A display device may include a substrate including a display area and a non-display area disposed adjacent to the display area, a display panel disposed on the substrate and overlapping the display area, data pads disposed on the substrate and overlapping the non-display area, first panel magnetic patterns disposed on the substrate, overlapping the non-display area, and connected to each other, a film facing the substrate, first film magnetic patterns disposed on the film, contacting the first panel magnetic patterns, and connected to each other.

In an embodiment, the data pads, the first panel magnetic patterns, and the first film magnetic patterns may extend in a first direction.

In an embodiment, the display device may further include second panel magnetic patterns disposed on the substrate, extending in the first direction, disposed between the first panel magnetic patterns, and connected to each other and second film magnetic patterns disposed on the second panel magnetic patterns, extending in the first direction, contacting the second panel magnetic patterns, and connected to each other.

Therefore, a display device according to embodiments of the present inventive concept may include a panel magnetic part and a film magnetic part. In a method of manufacturing the display device, a film may be precisely aligned on a substrate by using the panel magnetic part and the film magnetic part.

In detail, in the method of manufacturing the display device, the first panel magnetic patterns may have a first magnetic property (e.g., S pole), and the first film magnetic patterns may have a second magnetic property (e.g., N pole). Due to an attractive force generated between the first panel magnetic patterns and the first film magnetic patterns, the first film magnetic patterns may be precisely aligned to overlap the first panel magnetic patterns. In addition, intensities of the first magnetic property and the second magnetic property may be adjusted. As the first panel magnetic patterns and the first film magnetic patterns extend in a first direction, alignment accuracy of the film in a second direction may be improved.

In addition, in the method of manufacturing the display device, as the third panel magnetic patterns and the third film magnetic patterns extend in the second direction, alignment accuracy of the film in the first direction may be improved.

BRIEF DESCRIPTION OF THE DRAWINGS

The accompanying drawings, which are included to provide a further understanding of the inventive concept and are incorporated in and constitute a part of this specification, illustrate embodiments of the inventive concept, and together with the description serve to explain the inventive concepts.

DETAILED DESCRIPTION

Figure 1:
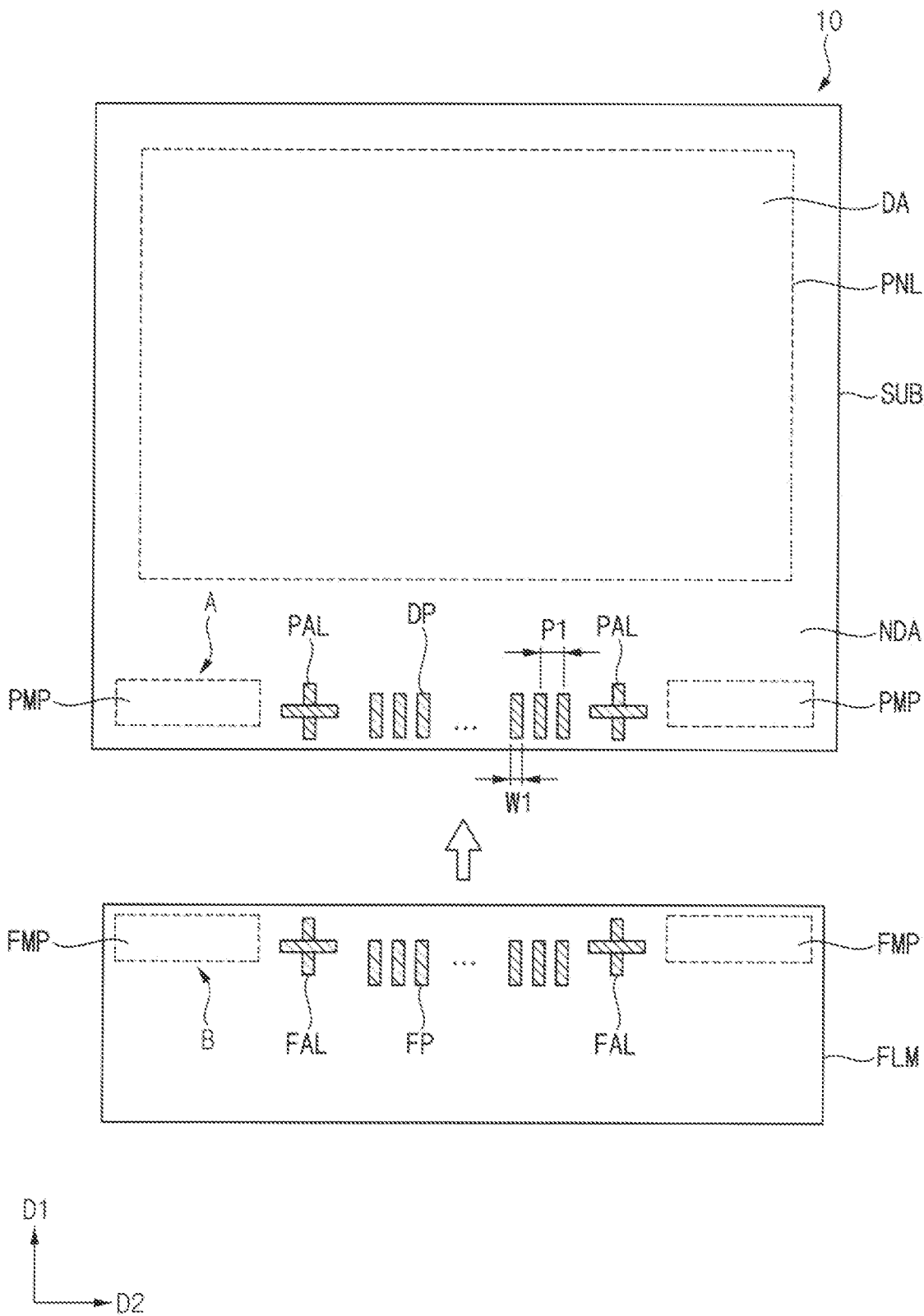
FIGS. 1 and 2 are plan views illustrating a display device according to an embodiment.

Illustrative, non-limiting embodiments will be more clearly understood from the following detailed description in conjunction with the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or"

includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the inventive concept, and will not be interpreted in an idealized or overly formal sense unless expressly so defined herein.

Figure 2:
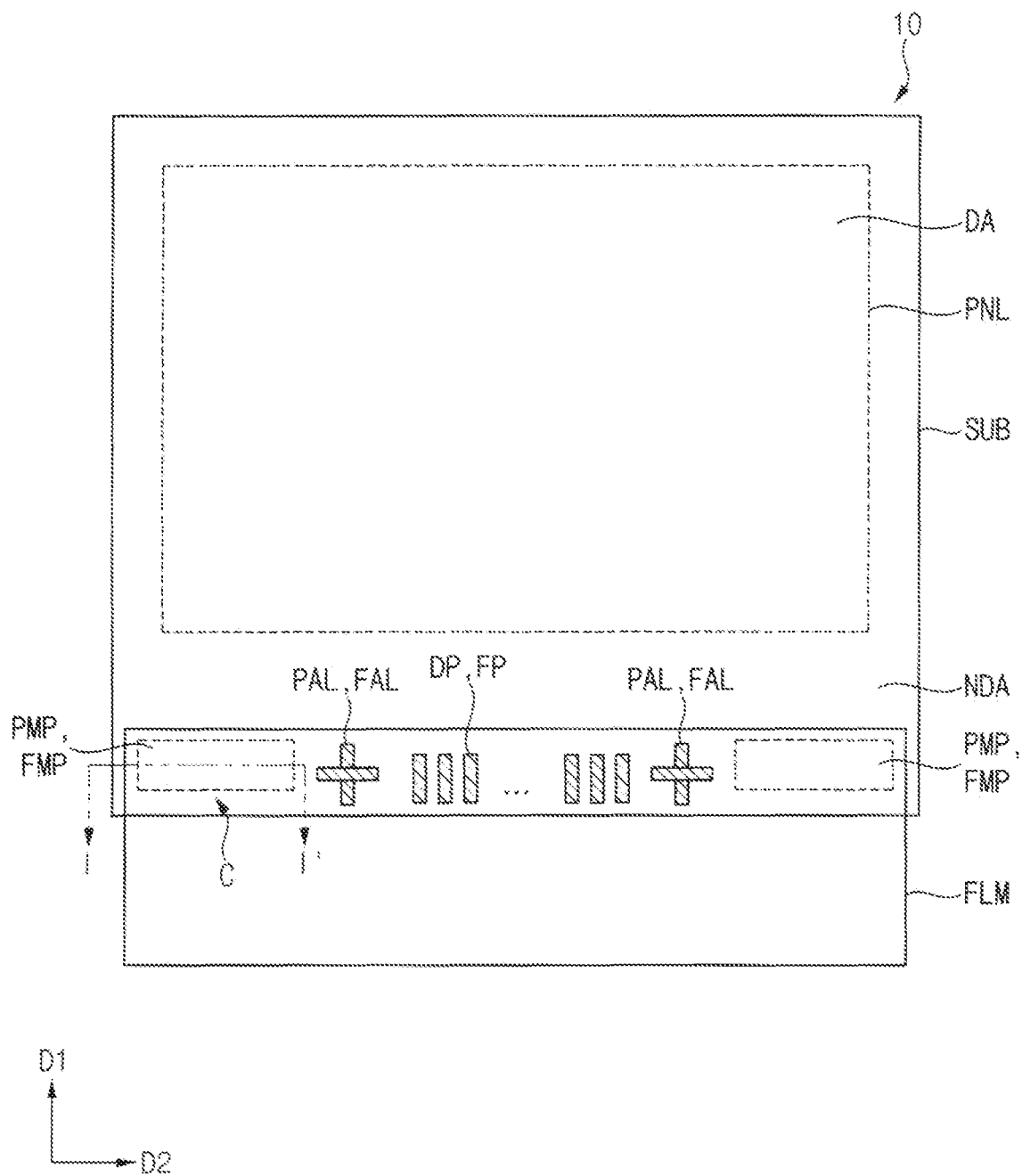

FIGS. 1 and 2 are plan views illustrating a display device according to an embodiment.

Referring to FIGS. 1 and 2, a display device 10 according to an embodiment may include a substrate SUB, a display panel PNL, a film FLM, data pads DP, film pads FP, a panel alignment key PAL, a film alignment key FAL, a panel magnetic part PMP, and a film magnetic part FMP. The film FLM may be disposed on the substrate using the panel alignment key PAL, the film alignment key FAL, the panel magnetic part PMP, and the film magnetic part FMP.

The substrate SUB may include a display area DA and a non-display area NDA. In an embodiment, the display area DA may have a rectangular shape and the non-display area NDA may be disposed adjacent to the display area DA. For example, the non-display area NDA may surround the display area DA. In an embodiment, as shown in FIGS. 1 and 2, the non-display area NDA may have a rectangular shape with a constant width. In another embodiment, the non-display area NDA may have a shape in which the width becomes narrower toward the lower end of the substrate SUB in a plan view.

In an embodiment, the data pads DP, the panel alignment key PAL, and the panel is magnetic part PMP may be disposed on the substrate SUB and may overlap the non-display area NDA. For example, as shown in FIGS. 1 and 2, two panel alignment keys PAL and two panel magnetic parts PMP may be formed. The two panel magnetic part PMP may be disposed to be symmetrical to each other with respect to the data pads DP. The panel alignment key PAL may be disposed between the panel magnetic part PMP and the data pads DP. In addition, a TEG pattern for monitoring a manufacturing process may be further formed in the non-display area NDA on the substrate SUB. However, positions at which the data pads DP, the panel alignment key PAL, and the panel magnetic part PMP are disposed are not limited thereto.

The display panel PNL may be disposed on the substrate SUB and may overlap the display area DA. The display panel PNL may receive a signal and/or a voltage, and may display an image.

In an embodiment, the display panel PNL may receive a data voltage from the film FLM through the data pads DP which is connected to the film pads FP. For example, the data pads DP may extend in a first direction D1 and may be spaced apart from each other in a second direction D2 intersecting the first direction D1. Accordingly, the data pads DP may have a first pitch P1 in the second direction D2. In addition, each of the data pads DP may have a first width W1 in the second direction D2.

In addition, the display panel PNL may further receive a driving voltage (e.g., a high power supply voltage ELVDD) through a driving power pad (not shown) disposed adjacent to the data pads DP, and a common voltage (e.g. a low power supply voltage ELVSS) through a common power pad (not shown) disposed adjacent to the data pad DP.

As shown in FIG. 2, the film FLM may be disposed on the substrate SUB and may overlap the non-display area NDA. Drivers (not shown) may be disposed on the film FLM. For example, a data driver generating the data voltage may be disposed on the film FLM. In addition, a power management part (e.g., a power management integrated circuit PMIC) that generates the driving voltage and/or the common voltage may be further disposed on the film FLM.

In an embodiment, the film pads FP, the film alignment key FAL, and the film magnetic part FMP may be disposed under the film FLM and may overlap the non-display area NDA.

In an embodiment, the film pads FP may be formed in areas correspond to the data pads DP. For example, the film pads FP may be formed to have the same pitch, width and length as the data pads DP.

Referring to FIGS. 1 and 2, the film FLM may be aligned so that the film pads FP overlap the data pads DP in a plan view. In order to precisely align the film FLM on the substrate SUB, the panel magnetic part PMP, the film magnetic part FMP, the panel alignment key PAL, and the film alignment key FAL may be used.

By photographing the panel alignment key PAL and the film alignment key FAL after the film FLM is attached to the substrate SUB, it can be checked whether the film FLM is properly attached to the substrate SUB.

Figure 3:
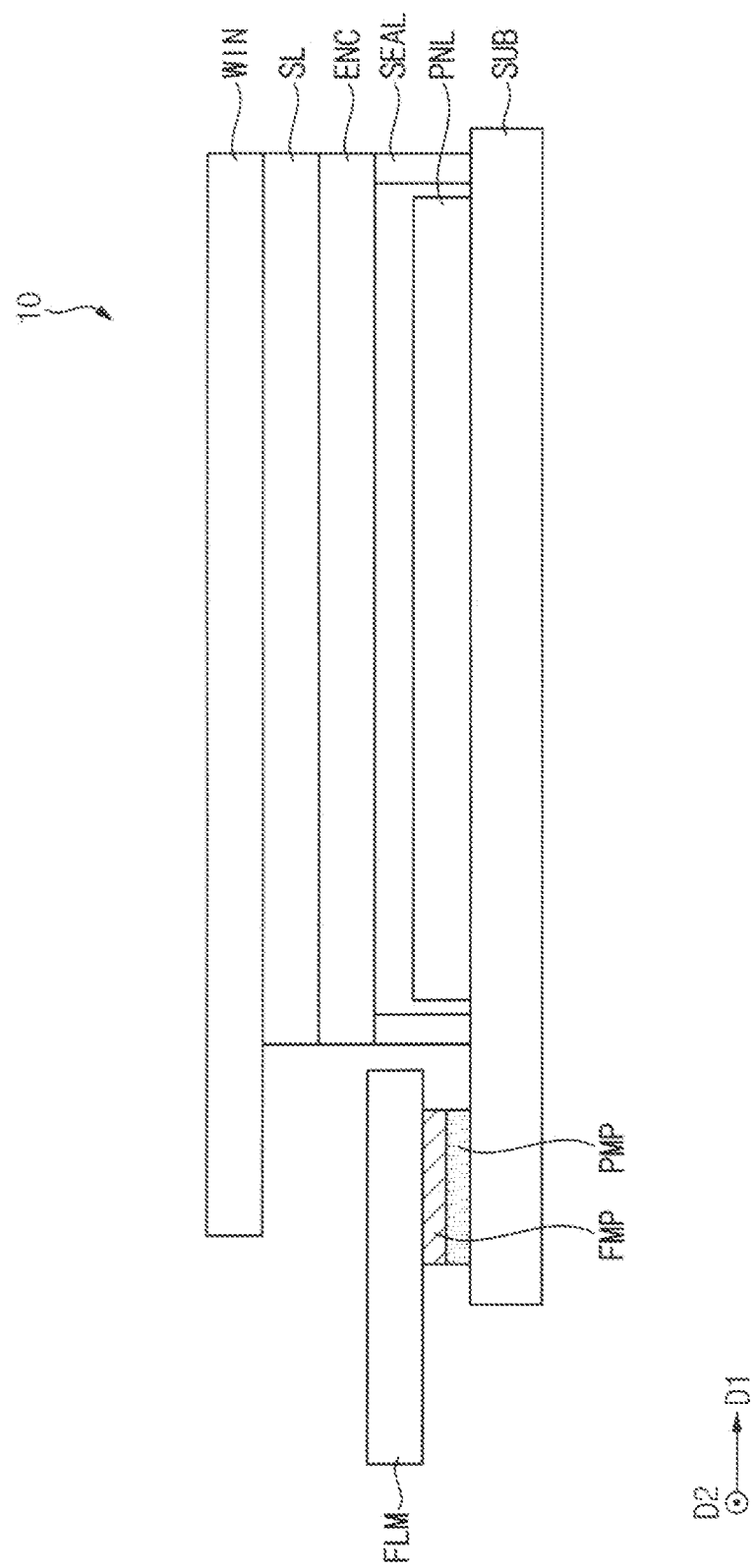
FIG. 3 is a cross-sectional view illustrating the display device of FIG. 2.

FIG. 3 is a cross-sectional view illustrating the display device of FIG. 2.

Referring to FIGS. 2 and 3, the display device 10 may include the substrate SUB, the display panel PNL, a sealing member SEAL, an encapsulation substrate ENC, a sensing layer SL, a window WIN, the panel magnetic part PMP, the film FLM, and the film magnetic part FMP.

The substrate SUB may include a transparent or opaque material. For example, the substrate SUB may include glass, quartz, plastic, or the like. When the substrate SUB includes glass, the display device 10 may be a rigid display device. When the substrate SUB includes plastic, the display device 10 may be a flexible display device. When the display device is a flexible display device, the film FLM may be disposed under the substrate SUB.

The display panel PNL may be disposed on the substrate SUB. The display panel PNL will be described with reference to FIG. 13.

The encapsulation substrate ENC may face the substrate SUB and may be disposed on the display panel PNL. In an embodiment, the encapsulation substrate ENC may have a shape substantially the same as a shape of the substrate SUB, and may include a material substantially the same as a material of the substrate SUB. In another embodiment, the encapsulation substrate ENC may have a different shape and/or a different area from the substrate SUB. In addition, the encapsulation substrate ENC may include a material different from a material of the substrate SUB.

In an embodiment, the sealing member SEAL may be disposed between the substrate SUB and the encapsulation substrate ENC. The sealing member SEAL may be formed to surround the display panel PNL in a plan view. The sealing member SEAL may protect the display panel PNL from foreign substances and/or moisture. In another embodiment, the sealing member SEAL may be omitted. In this case, an encapsulation layer may be added on the display panel PNL and the encapsulation layer may protect the display panel PNL.

The sensing layer SL may be disposed on the encapsulation substrate ENC. The sensing layer SL may sense a user's approach and/or touch. For example, the sensing layer SL may include a plurality of sensing electrodes and a capacitance may be formed between the sensing electrodes. The sensing layer SL may sense the approach and/or touch using the capacitance.

The window WIN may be disposed on the sensing layer SL. The window WIN may include glass and/or plastic. The window WIN may protect the sensing layer SL, the display panel PNL, the film FLM, and the like.

The film FLM may be disposed on the substrate SUB. Accordingly, the film magnetic part FMP may contact the panel magnetic part PMP. In addition, the film pads FP formed on the film FLM may contact the data pads DP formed on the substrate SUB.

Figure 4:
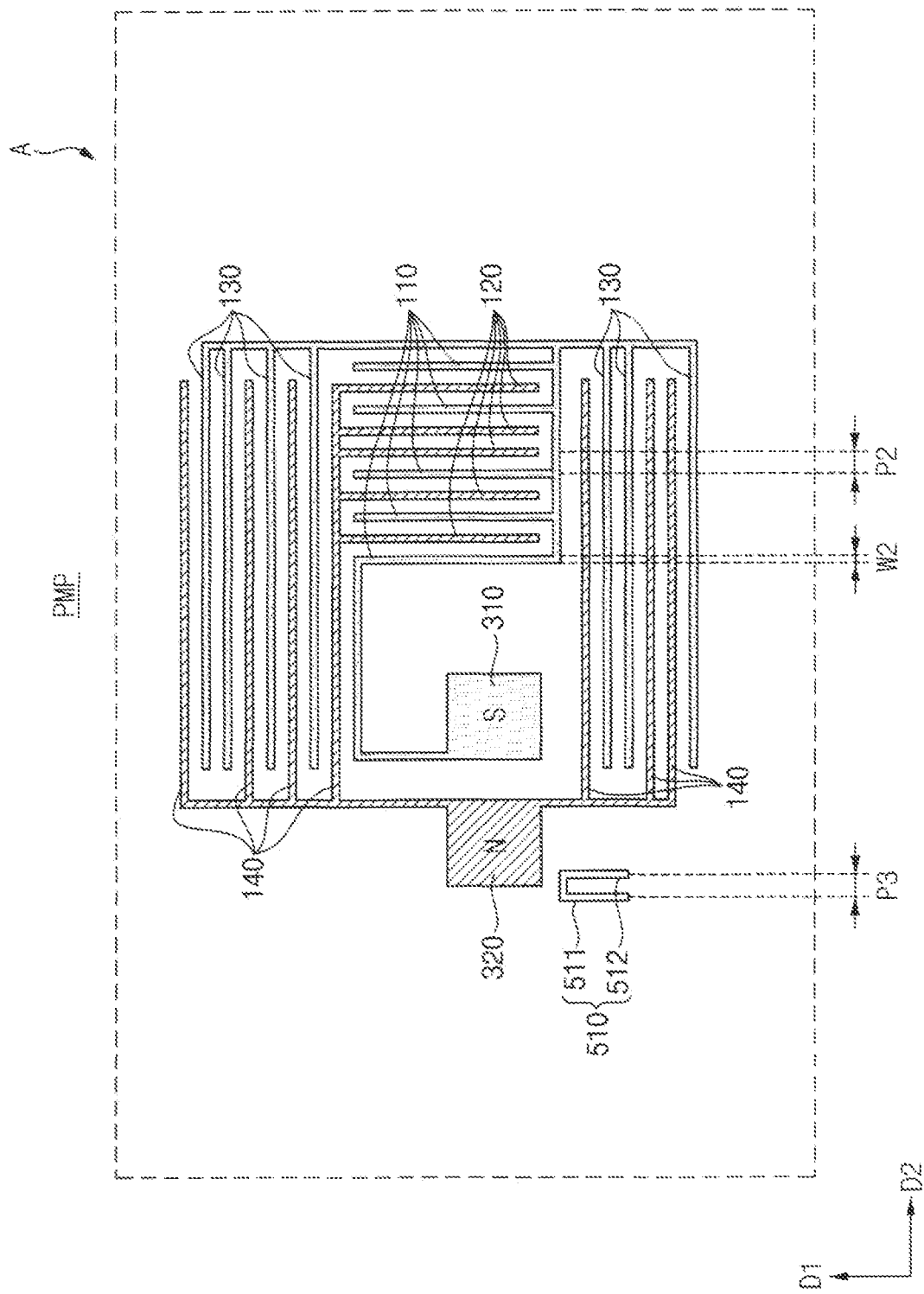
FIG. 4 is an enlarged view of an area A of FIG. 1.
Figure 5:
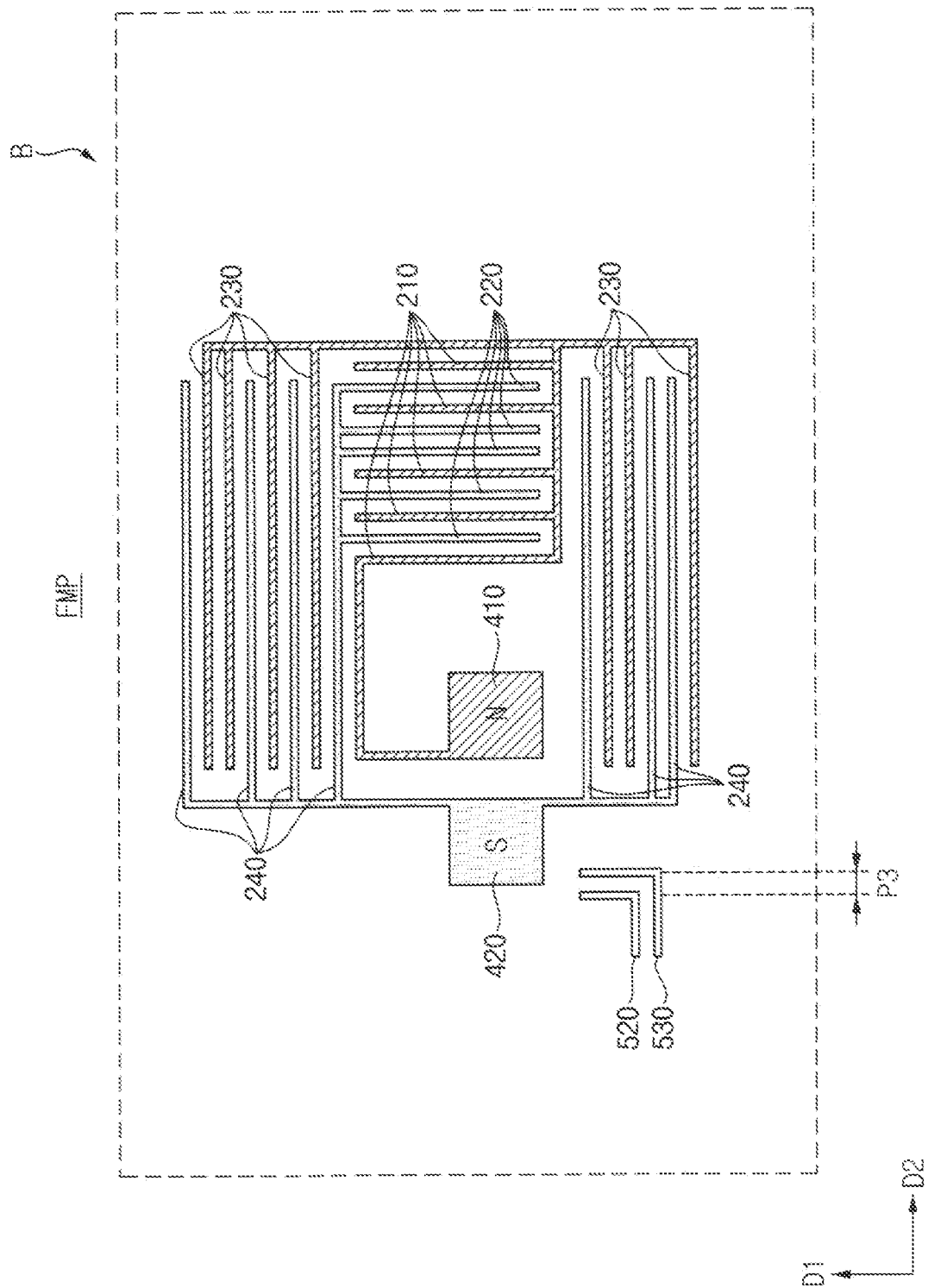
FIG. 5 is an enlarged view of an area B of FIG. 1.
Figure 6:
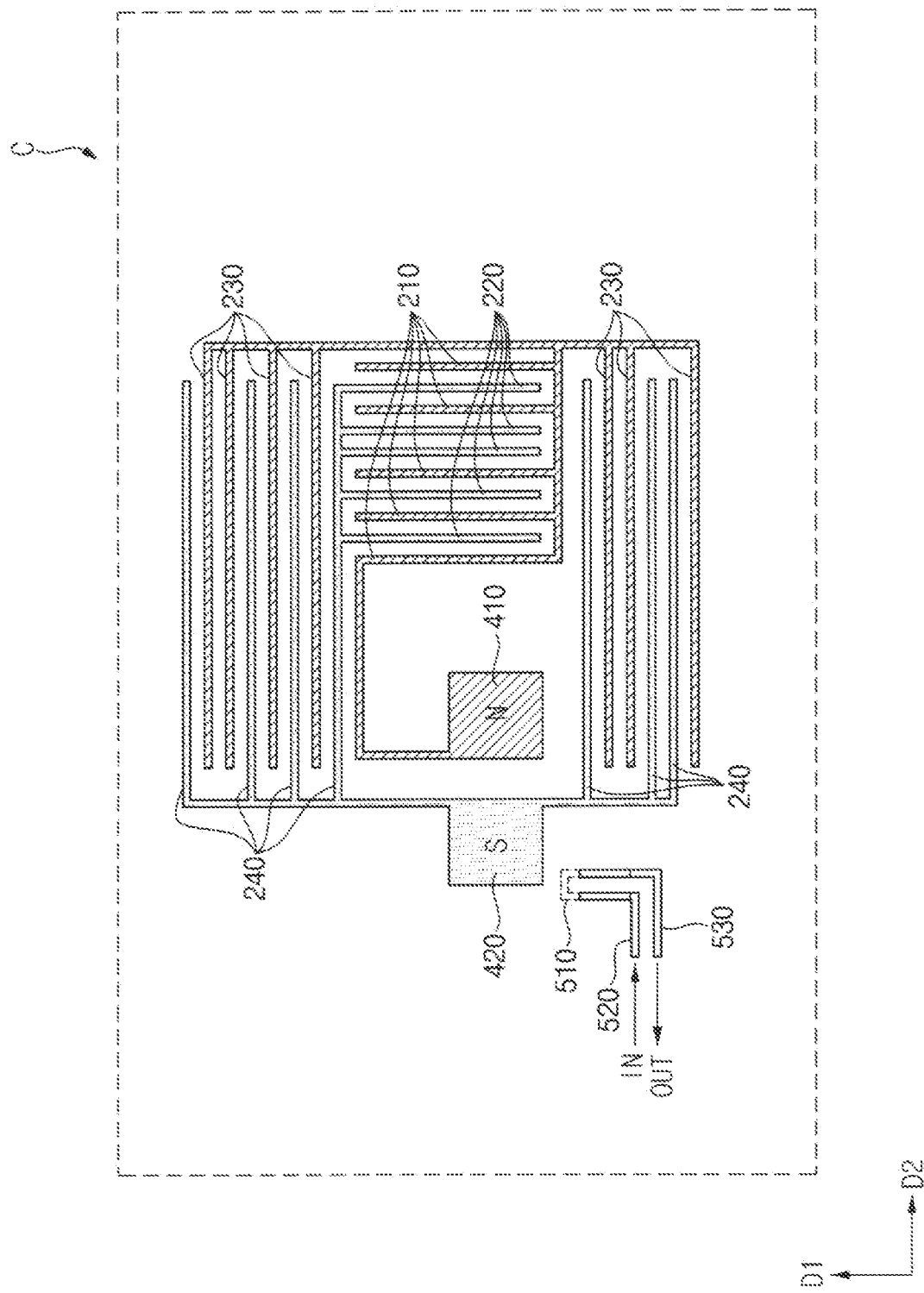
FIG. 6 is an enlarged view of an area C of FIG. 2.
Figure 7:
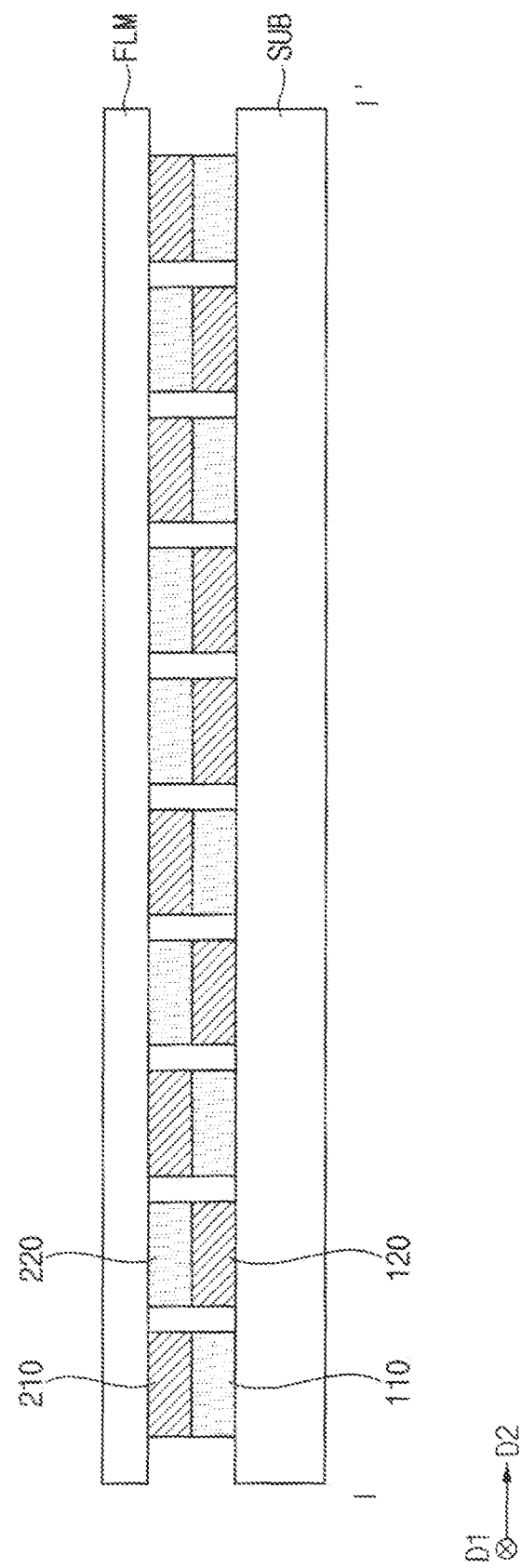
FIG. 7 is a cross-sectional view illustrating first panel magnetic patterns and first film magnetic patterns included in the display device of FIG. 2.

FIG. 4 is an enlarged view of an area A of FIG. 1. FIG. 5 is an enlarged view of an area B of FIG. 1. FIG. 6 is an enlarged view of an area C of FIG. 2. FIG. 7 is a cross-sectional view illustrating first panel magnetic patterns and first film magnetic patterns included in the display device of FIG. 2. For example, FIG. 7 is a cross-sectional view taken along line I-I' of FIG. 2.

Referring to FIGS. 1 and 4, the panel magnetic part PMP may include first panel magnetic patterns 110, second panel magnetic patterns 120, third panel magnetic patterns 130, fourth panel magnetic patterns 140, a first panel magnetic input 310, a second panel magnetic input 320, and a conductor 510.

In an embodiment, the panel magnetic part PMP may be formed together with the data pad DP. In other words, the panel magnetic part PMP may include the same material as the data pad DP. For example, the panel magnetic part PMP may include a metal, an alloy, a conductive metal oxide, a transparent conductive material, or the like. The panel magnetic part PMP may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The first panel magnetic patterns 110 may be formed on the substrate SUB and may overlap the non-display area NDA. The first panel magnetic patterns 110 may extend in the first direction D1 and may be spaced apart from each other in the second direction D2. The first panel magnetic patterns 110 may be connected to the first panel magnetic input 310 through a first connecting line.

In an embodiment, each of the first panel magnetic patterns 110 may have a second width W2 in the second direction D2. The second width W2 may be smaller than the first width W1 of each of the data pads DP. However, the relationship between the first and second widths W1 and W2 is not limited thereto.

The second panel magnetic patterns 120 may be formed on the substrate SUB and may overlap the non-display area NDA. The second panel magnetic patterns 120 may extend in the first direction D1 and may be spaced apart from each other in the second direction D2. The second panel magnetic patterns 120 may be connected to the second panel magnetic input 320 through a second connecting line.

In an embodiment, the second panel magnetic patterns 120 may be disposed between the first panel magnetic patterns 110. A second pitch P2 in the second direction D2 may be defined between the first panel magnetic patterns 110 and the second panel magnetic patterns 120 adjacent to each other. The second pitch P2 may be smaller than the first pitch P1. However, the relationship between the first and second pitches P1 and P2 is not limited thereto.

The first panel magnetic patterns 110 and the second panel magnetic patterns 120 may improve an alignment accuracy of the film FLM in the second direction D2.

In an embodiment, the first panel magnetic patterns 110 and the second panel magnetic patterns 120 may be irregularly arranged. For example, an order in which the first panel magnetic patterns 110 and the second panel magnetic patterns 120 are arranged may be set as needed. The first panel magnetic patterns 110 and the second panel magnetic patterns 120 may be alternatingly disposed along the second direction D2. For example, as shown in FIG. 4, when each of the first panel magnetic patterns 110 is referred to as 'a' and each of the second panel magnetic patterns 120 is referred to as 'b', the first panel magnetic patterns 110 and the second panel magnetic patterns 120 may be arranged in the order of a, b, a, b, a, b, b, a, b, a along the second direction.

The third panel magnetic patterns 130 may be formed on the substrate SUB and may overlap the non-display area NDA. The third panel magnetic patterns 130 may extend in the second direction D2 and may be spaced apart from each other in the first direction D1. The third panel magnetic patterns 130 may be connected to the first panel magnetic input 310 through the first connecting line.

The fourth panel magnetic patterns 140 may be formed on the substrate SUB and may overlap the non-display area NDA. The fourth panel magnetic patterns 140 may extend in the second direction D2 and may be spaced apart from each other in the first direction D1. The fourth panel magnetic patterns 140 may be connected to the second panel magnetic input 320 through the second connecting line.

In an embodiment, the fourth panel magnetic patterns 140 may be disposed between the third panel magnetic patterns 130. In addition, the third panel magnetic patterns 130 and the fourth panel magnetic patterns 140 may be irregularly arranged. The third panel magnetic patterns 130 and the fourth panel magnetic patterns 140 may be alternatingly disposed along the first direction D1. The third panel magnetic patterns 130 and the fourth panel magnetic patterns 140 may improve the alignment accuracy of the film FLM in the first direction D1.

The first panel magnetic input 310 may be connected to the first panel magnetic patterns 110 and the third panel magnetic patterns 130 through the first connecting line. The first panel magnetic input 310 may input a first magnetism to the first panel magnetic patterns 110 and the third panel magnetic patterns 130. For example, the first panel magnetic input 310 may be a pad having a predetermined area. As a magnetic material contacts the first panel magnetic input 310, the first panel magnetic input 310 may input the first magnetism to the first panel magnetic patterns 110 and the third panel magnetic patterns 130. Accordingly, the first panel magnetic patterns 110 and the third panel magnetic patterns 130 may have a first magnetic property (e.g., S pole).

The second panel magnetic input 320 may be connected to the second panel magnetic patterns 120 and the fourth panel magnetic patterns 140 through the second connecting line. The second panel magnetic input 320 may input a second magnetism to the second panel magnetic patterns 120 and the fourth panel magnetic patterns 140. Accordingly, the second panel magnetic patterns 120 and the fourth panel magnetic patterns 140 may have a second magnetic property (e.g., an N pole).

In an embodiment, the first and second panel magnetic inputs 310 and 320 may be disposed on the substrate SUB and may overlap the non-display area NDA. In another embodiment, the first and second panel magnetic inputs 310 and 320 may be formed on a mother substrate used in a manufacturing process of the display device 10.

The conductor 510 may be disposed on the substrate SUB and may overlap the non-display area NDA. The conductor 510 may be an integrally formed conductive pattern. In an embodiment, the conductor 510 may include a first end 511 extending in the first direction D1 and a second end 512 extending in the first direction D1. The first end 511 may be spaced apart from the second end 512 by a third pitch P3 and connected to the second end 512 through a third connecting line. In an embodiment, the third pitch P3 may be substantially the same as the second pitch P2. However, the relationship of the first to third pitches P1, P2, and P3 is not limited thereto, and may be appropriately set as necessary.

Referring to FIGS. 1 and 5, the film magnetic part FMP may include first film magnetic patterns 210, second film magnetic patterns 220, third film magnetic patterns 230, fourth film magnetic patterns 240, a first film magnetic input 410, a second film magnetic input 410, a test current input 520, and a test current output 530. The film magnetic part FMP may have substantially the same shape as the panel magnetic part PMP except for the test current input 520 and the test current output 530.

In an embodiment, the film magnetic part FMP may be formed together with the film pad FP. In other words, the film magnetic part FMP may include the same material as the film pad FP. For example, the film magnetic part FMP may include a metal, an alloy, a conductive metal oxide, a transparent conductive material, or the like.

The first film magnetic patterns 210 may be formed under the film FLM and may overlap the non-display area NDA. The first film magnetic patterns 210 may be formed in areas to correspond to the first panel magnetic patterns 110 in a plan view. For example, the first film magnetic patterns 210 may extend in the first direction D1 and may be spaced apart from each other in the second direction D2. The first film magnetic patterns 210 may be connected to the first film magnetic input 410 through a fourth connecting line.

The second film magnetic patterns 220 may be formed under the film FLM and is may overlap the non-display area NDA. The second film magnetic patterns 220 may be formed in areas to correspond to the second panel magnetic patterns 120 in a plan view. For example, the second film magnetic patterns 220 may extend in the first direction D1 and may be spaced apart from each other in the second direction D2. The second film magnetic patterns 220 may be connected to the second film magnetic input 420 through a fifth connecting line.

In an embodiment, the second film magnetic patterns 220 may be disposed between the first film magnetic patterns 210. The first film magnetic patterns 210 and the second film magnetic patterns 220 may improve the alignment accuracy of the film FLM in the first direction D1.

An order in which the first film magnetic patterns 210 and the second film magnetic patterns 220 are arranged may be set as needed. The first film magnetic patterns 210 and the second film magnetic patterns 220 may be alternatingly disposed along the second direction D2. For example, as shown in FIG. 5, when each of the first film magnetic patterns 210 is referred to as 'c' and each of the second film magnetic patterns 220 is referred to as 'd', the first film magnetic patterns 210 and the second film magnetic patterns 220 may be arranged in the order of c, d, c, d, c, d, d, c, d, c along the second direction.

The third film magnetic patterns 230 may be formed under the film FLM and may overlap the non-display area NDA. The third film magnetic patterns 230 may be formed in areas to correspond to the third panel magnetic patterns 130 in a plan view. For example, the third magnetic film patterns 230 may extend in the second direction D2 and may be spaced apart from each other in the first direction D1. The third film magnetic patterns 230 may be connected to the first film magnetic input 410 through the fourth connecting line.

The fourth film magnetic patterns 240 may be formed under the film FLM and may overlap the non-display area NDA. The fourth film magnetic patterns 240 may be formed in areas to correspond to the fourth panel magnetic patterns 140 in a plan view. For example, the fourth film magnetic patterns 240 may extend in the second direction D2 and may be spaced apart from each other in the first direction D1. The fourth film magnetic patterns 240 may be connected to the second film magnetic input 420 through a fifth connecting line.

In an embodiment, the fourth film magnetic patterns 240 may be disposed between the third film magnetic patterns 230. The third film magnetic patterns 230 and the fourth film magnetic patterns 240 may be alternatingly disposed along the first direction D1. The third film magnetic patterns 230 and the fourth film magnetic patterns 240 may improve the alignment accuracy of the film FLM in the first direction D1.

The first film magnetic input 410 may be connected to the first film magnetic patterns 210 and the third film magnetic patterns 230 through the fourth connecting line. The first film magnetic input 410 may input the second magnetism to the first film magnetic patterns 210 and the third film magnetic patterns 230. Accordingly, the first film magnetic patterns 210 and the third film magnetic patterns 230 may have the second magnetic property (e.g., the N pole).

The second film magnetic input 420 may be connected to the second film magnetic patterns 220 and the fourth film magnetic patterns 240. The second film magnetic input 420 may input the first magnetism to the second film magnetic patterns 220 and the fourth film magnetic patterns 240. Accordingly, the second film magnetic patterns 220 and the fourth film magnetic patterns 240 may have the first magnetic property (e.g., the S pole).

The test current input 520 may be disposed under the film FLM and may overlap the non-display area NDA. The test current input 520 may be formed in an area to correspond to the first end 511 of the conductor 510 in a plan view.

The test current output 530 may be disposed under the film FLM and may overlap the non-display area NDA. The test current output 530 may be formed in an area to correspond to the second end 512 of the conductor 510 in a plan view.

Referring to FIGS. 2, 4, 5, 6 and 7, the first film magnetic patterns 210 may contact the first panel magnetic patterns 110 in a plan view. The second film magnetic patterns 220 may contact the second panel magnetic patterns 120 in a plan view. The third film magnetic patterns 230 may contact the third panel magnetic patterns 130 in a plan view. The fourth film magnetic patterns 240 may contact the fourth panel magnetic patterns 140 in a plan view.

The test current input 520 may contact the first end 511 of the conductor 510, and the test current output 530 may contact the second end 512 of the conductor 510. When the film FLM is precisely aligned on the substrate SUB, the test current input to the test current input 520 may be output to the test current output 530 through the conductor 510.

Figure 8:
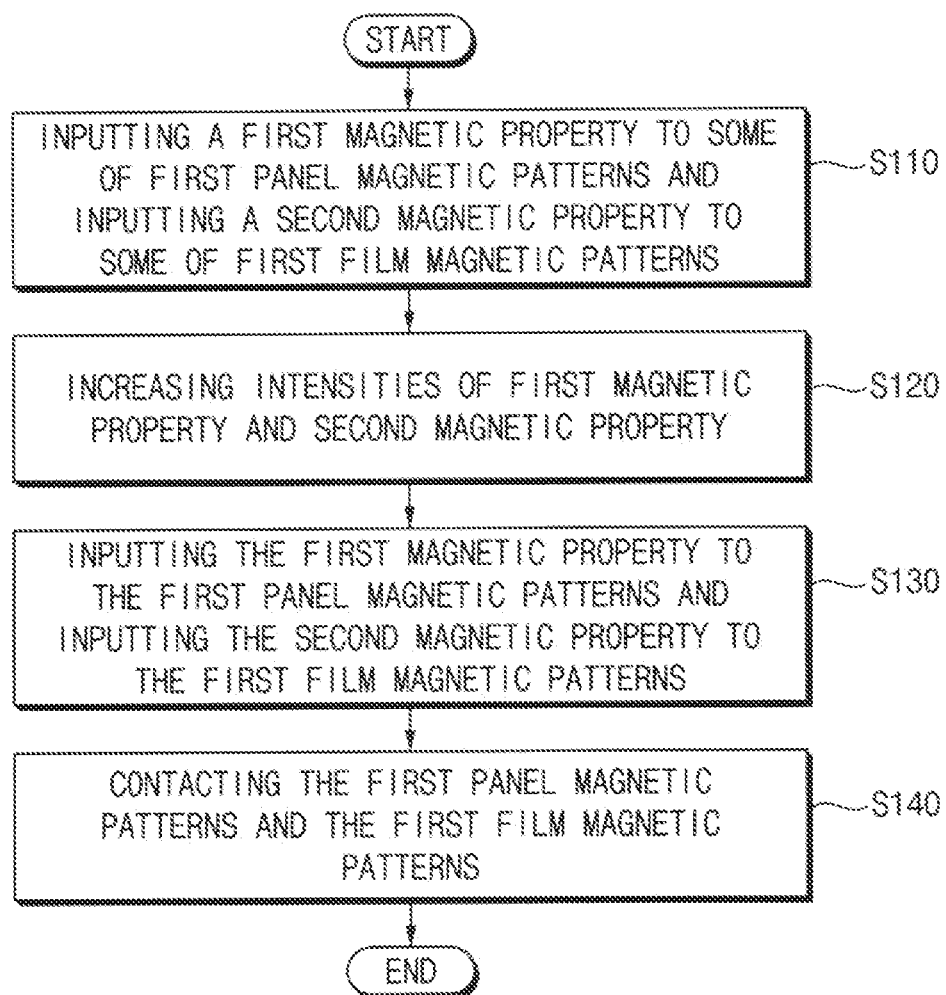
FIG. 8 is a flowchart illustrating a method of manufacturing the display device of FIG. 2.

FIG. 8 is a flowchart illustrating a method of manufacturing the display device of FIG. 2. FIGS. 9 to 12 are cross-sectional views illustrating a method of manufacturing the display device of FIG. 2. For example, FIGS. 9 to 12 are cross-sectional views illustrating a method of aligning a film on a substrate.

Figure 9:
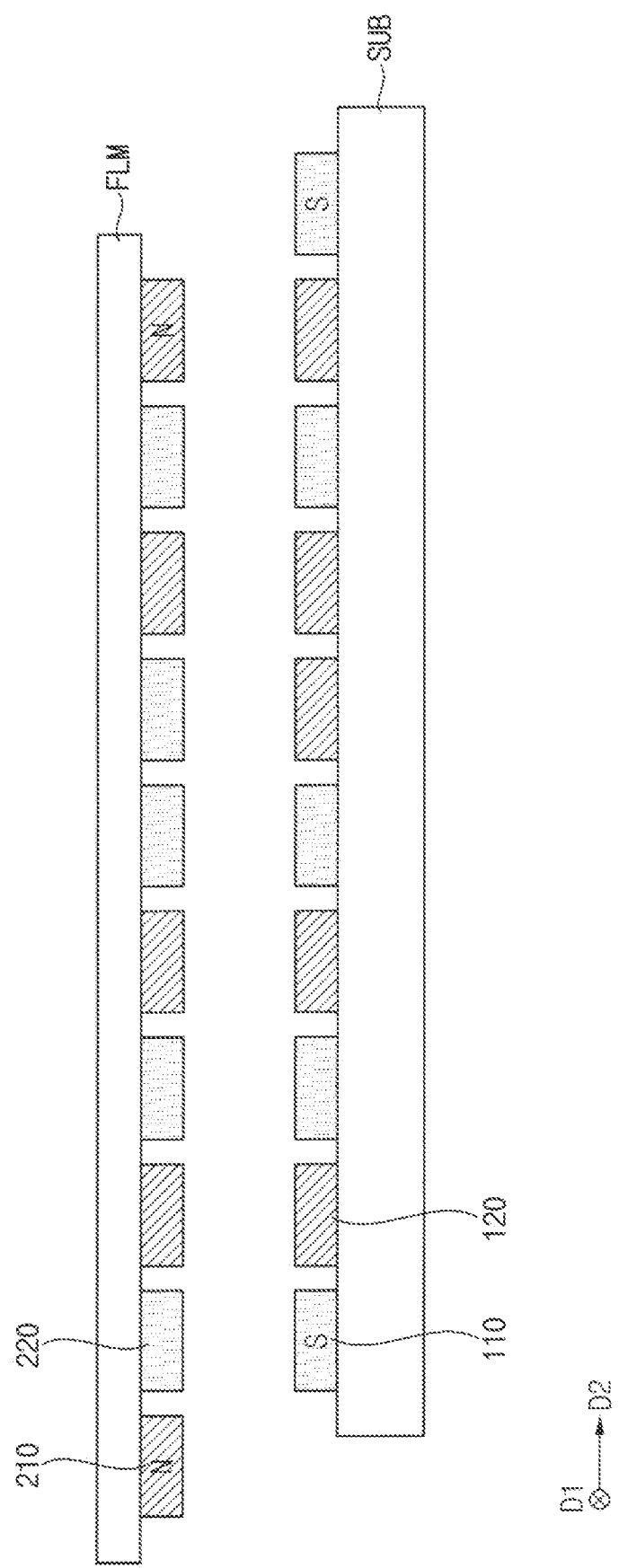
FIGS. 9, 10, 11 and 12 are cross-sectional views illustrating a method of manufacturing the display device of FIG. 2.

Referring to FIGS. 8 and 9, in an embodiment, some of the first panel magnetic patterns among the first panel magnetic patterns 110 may have the first magnetic property (e.g., the S pole) (S110). For example, as shown in FIG. 9, the first panel magnetic patterns disposed at the outermost among the first panel magnetic patterns 110 may have the first magnetic property (e.g., the S pole).

In an embodiment, some of the first film magnetic patterns among the first film magnetic patterns 210 may have the second magnetic property (e.g., the N pole) (S110). For example, as shown in FIG. 9, the first film magnetic patterns disposed at the outermost among the film panel magnetic patterns 210 may have the second magnetic property (e.g., the N pole).

Figure 10:
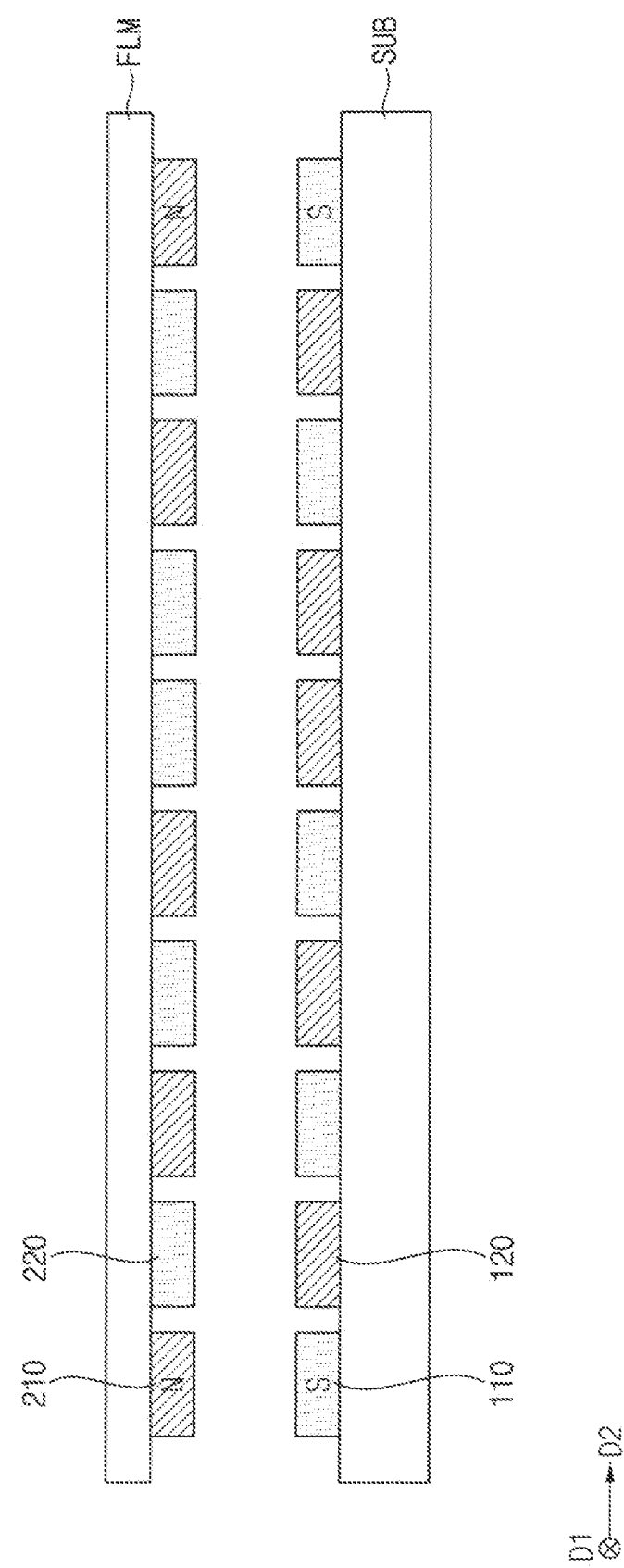

Referring to FIGS. 8 and 10, an intensity of the first magnetic property (e.g., the S pole) of the some of first panel magnetic patterns may be increased and an intensity of the second magnetic property (e.g., the N pole) of the some of first film magnetic patterns may be increased (S120). An attractive force may be generated between the first magnetic property and the second magnetic property. Accordingly, the first panel magnetic patterns 110 and the first film magnetic patterns 210 may be precisely aligned.

Figure 11:
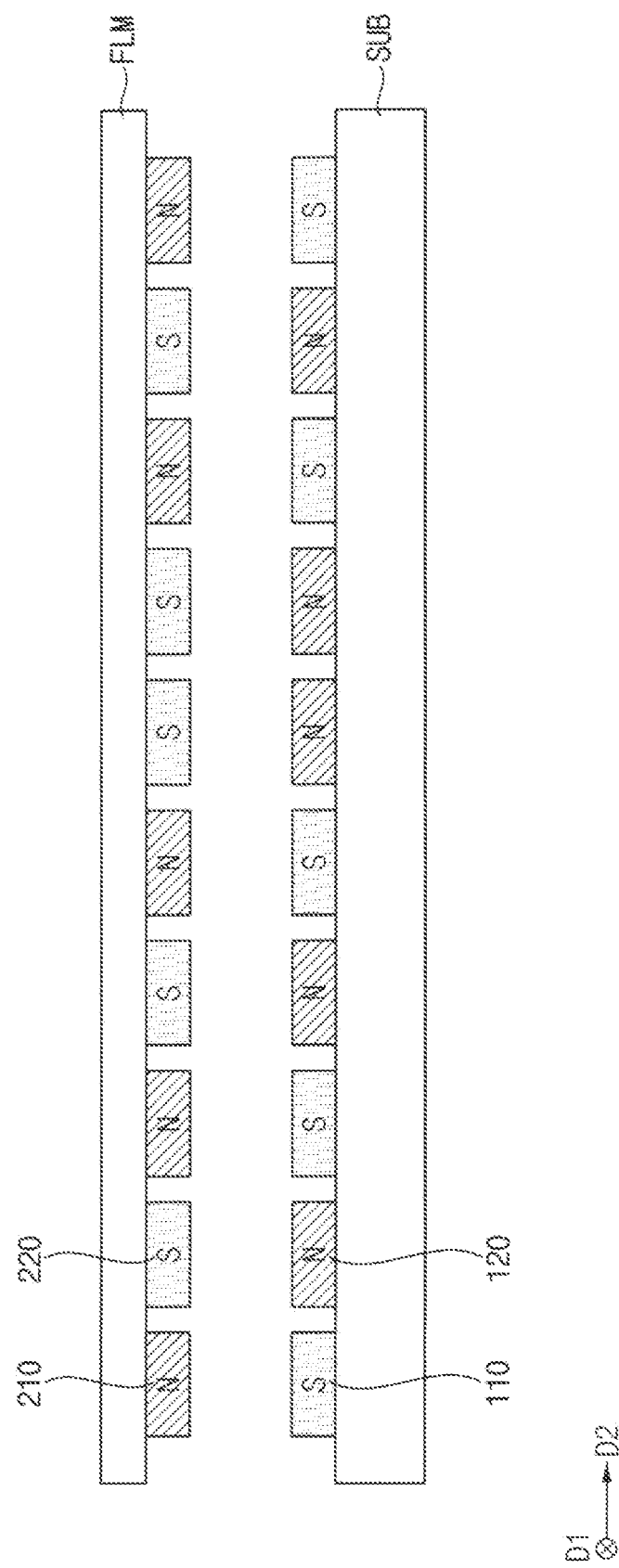

Referring to FIGS. 8 and 11, the first panel magnetic patterns 110 may have the first magnetic property (e.g., the S pole) and the first film magnetic patterns 210 may have the second magnetic property (e.g., the N pole) (S130). In addition, the second panel magnetic patterns 120 may have the second magnetic property (e.g., the N pole) and the second film magnetic patterns 220 may have the first magnetic property (e.g., the S pole). Accordingly, an attractive force may be generated between the first panel magnetic patterns 110 and the first film magnetic patterns 210 and an attractive force may be generated between the second panel magnetic patterns 120 and the second film magnetic pattern 220.

Figure 12:
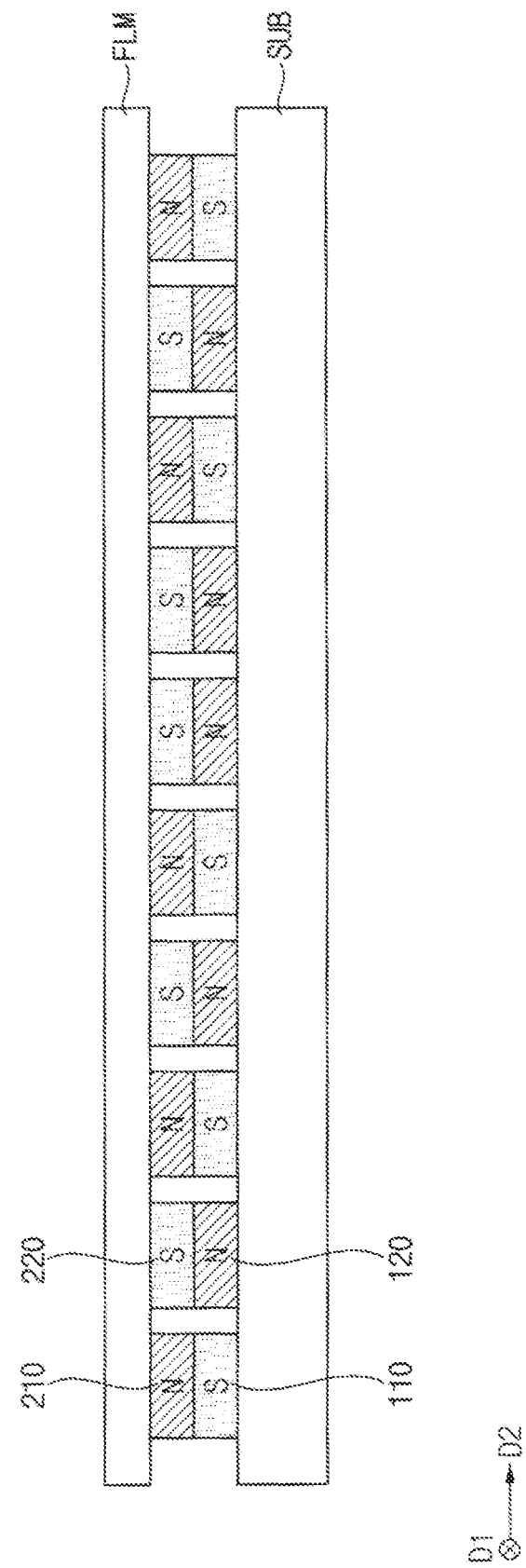

Referring to FIGS. 8 and 12, the first film magnetic patterns 210 may contact the first panel magnetic patterns 110 due to the attractive force (S140). In addition, the second film magnetic patterns 220 may contact the second panel magnetic patterns 120 due to the attractive force.

Figure 13:
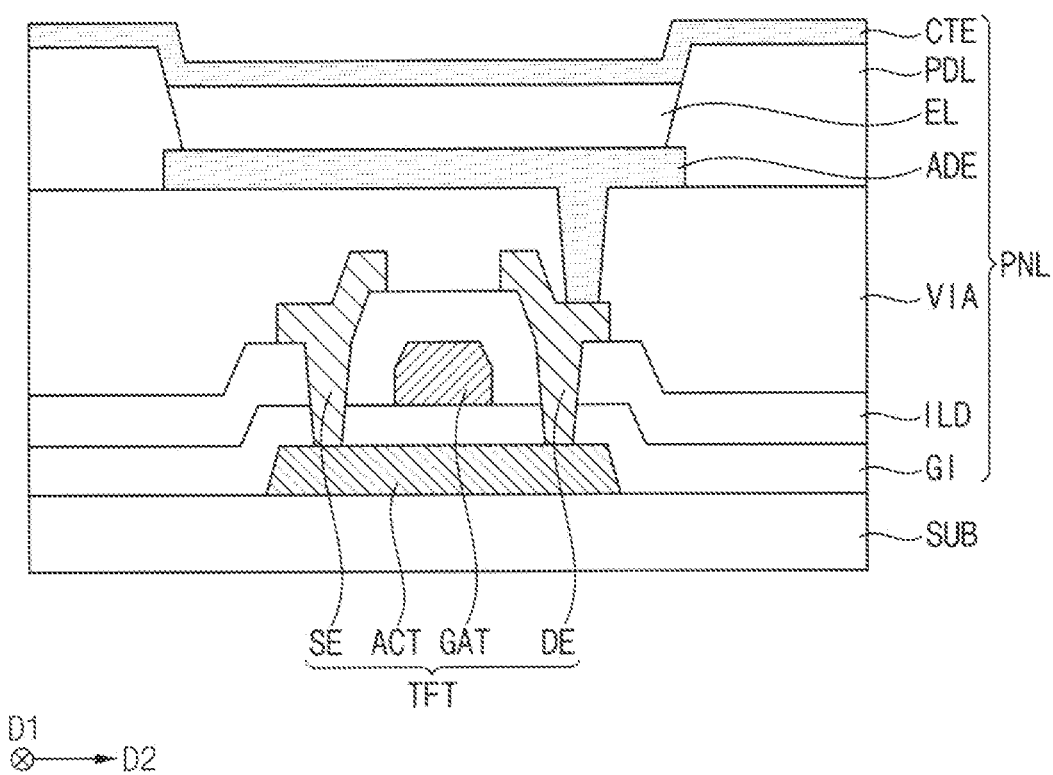
FIG. 13 is a cross-sectional view illustrating a display panel included in the display device of FIG. 2.

FIG. 13 is a cross-sectional view illustrating a display panel included in the display device of FIG. 2.

Referring to FIG. 13, the display panel PNL may include an active pattern ACT, a gate insulating layer GI, a gate electrode GAT, an interlayer insulating layer ILD, a source electrode SE, a drain electrode DE, a via insulating layer VIA, a first electrode ADE, a pixel defining layer PDL, an emission layer EL, and a second electrode CTE. The active pattern ACT, the gate electrode GAT, the source electrode SE, and the drain electrode DE may constitute a transistor TFT.

The active pattern ACT may be disposed on the substrate SUB. In an embodiment, the active pattern ACT may include a silicon semiconductor. For example, the active pattern ACT may include amorphous silicon, polycrystalline silicon, or the like. In another embodiment, the active pattern ACT may include an oxide semiconductor.

The gate insulating layer GI may cover the active pattern ACT and may be disposed on the substrate SUB. The gate insulating layer GI may include an inorganic insulating material. For example, the gate insulating layer GI may include silicon oxide, silicon nitride, silicon oxynitride, or the like.

The gate electrode GAT may be disposed on the gate insulating layer GI. The gate electrode GAT may include a metal, an alloy, a conductive metal oxide, a transparent conductive material, or the like. For example, the gate electrode GAT may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The interlayer insulating layer ILD may cover the gate electrode GAT and may be disposed on the gate insulating layer GI. The interlayer insulating layer ILD may include an inorganic insulating material.

The source electrode SE and the drain electrode DE may be disposed on the interlayer insulating layer ILD. In an embodiment, the source electrode SE and the drain electrode DE may contact the active pattern ACT. The source electrode SE and the drain electrode DE may include a metal, an alloy, a conductive metal oxide, a transparent conductive material, or the like.

The via insulating layer VIA may cover the source electrode SE and the drain electrode DE and may be disposed on the interlayer insulating layer ILD. The via insulating layer VIA may include an organic insulating material. For example, the via insulating layer VIA may include a photoresist, a polyacrylic resin, a polyimide resin, an acrylic resin, or the like. Accordingly, the via insulating layer VIA may have a substantially flat top surface.

The first electrode ADE may be disposed on the via insulating layer VIA. In an embodiment, the first electrode ADE may contact the drain electrode DE. The first electrode ADE may include a reflective metal material or a transparent metal material. For example, the first electrode ADE may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. In addition, the first electrode ADE may have a multilayer structure including Ag/ITO/Ag.

The pixel defining layer PDL may cover an end of the first electrode ADE and may be disposed on the via insulating layer VIA. The pixel defining layer PDL may include an organic material. An opening exposing the first electrode ADE may be formed in the pixel defining layer PDL.

The emission layer EL may be disposed on the first electrode ADE. For example, the emission layer EL may be disposed in the opening. The emission layer EL may generate light based on a voltage difference between the first electrode ADE and the second electrode CTE. In addition, in order to increase the luminous efficiency of the emission layer EL, the emission layer EL may include a functional layer (e.g., a hole injection layer, a hole transport layer, an electron transport layer, an electron injection layer, etc.).

The second electrode CTE may be disposed on the emission layer EL. The second electrode CTE may be formed in a plate shape and may include a reflective metal material or a transparent metal material.

The display device 10 according to an embodiment of the present inventive concept may include the panel magnetic part PMP and the film magnetic part FMP. In the method of manufacturing the display device 10, the film FLM may be precisely aligned on the substrate SUB using the panel magnetic part PMP and the film magnetic part FMP.

In detail, in the method of manufacturing the display device 10, the first panel magnetic patterns 110 may have the first magnetic property (e.g., the S pole), and the first film magnetic patterns 210 may have the second magnetic property (e.g., the N pole). Due to the attractive force generated between the first panel magnetic patterns 110 and the first film magnetic patterns 210, the first film magnetic patterns 210 may be arranged to overlap the first panel magnetic patterns 110. In addition, the intensities of the first magnetic property and the second magnetic property may be adjusted. As the first panel magnetic patterns 110 and the first film magnetic patterns 210 extend in the first direction D1, the alignment accuracy of the film FLM in the second direction D2 may be improved.

In addition, in the method of manufacturing the display device 10, as the third panel magnetic patterns 130 and the third film magnetic patterns 230 extend in the second direction D2, the alignment accuracy of the film FLM in the first direction D1 may be improved.

In addition, by photographing the panel alignment key PAL and the film alignment key FAL after the film FLM is attached to the substrate SUB, it can be checked whether the film FLM is properly attached to the substrate SUB. Furthermore, it can be checked whether the film FLM is properly attached to the substrate SUB using the conductor 510, the test current input 520, and the test current output 530.

Although certain embodiments and implementations have been described herein, other embodiments and modifications will be apparent from this description. Accordingly, the inventive concept is not limited to such embodiments, but rather various obvious modifications and equivalent arrangements would be apparent to a person of ordinary skill in the art.

What is claimed is:

1. A method of manufacturing a display device, the method comprising:
preparing a substrate including a display area and a non-display area disposed adjacent to the display area;
forming first panel magnetic patterns overlapping the non-display area and extending in a first direction on the substrate;
forming first film magnetic patterns extending in the first direction on a film;
inputting a first magnetism to the first panel magnetic patterns so that the first panel magnetic patterns have a first magnetic property;
inputting a second magnetism to the first film magnetic patterns so that the first film magnetic patterns have a second magnetic property;
aligning the film on the substrate so that the first film magnetic patterns overlap the first panel magnetic patterns in a plan view;
forming second panel magnetic patterns extending in the first direction and disposed between the first panel magnetic patterns; and
forming second film magnetic patterns extending in the first direction and disposed between the first film magnetic patterns.

2. The method of claim 1, wherein the first panel magnetic patterns and the second panel magnetic patterns are irregularly disposed.

3. The method of claim 2, wherein the first film magnetic patterns are formed to correspond to the first panel magnetic patterns, and
wherein the second film magnetic patterns are formed to correspond to the second panel magnetic patterns.

4. The method of claim 1, further comprising:
inputting the second magnetism to the second panel magnetic patterns so that the second panel magnetic patterns have the second magnetic property;
inputting the first magnetism to the second film magnetic patterns so that the second film magnetic patterns have the first magnetic property; and
aligning the film on the substrate so that the second film magnetic patterns overlap the second panel magnetic patterns in a plan view.

5. The method of claim 1, further comprising:
inputting the first magnetism to a first panel magnetic input connected to the first panel magnetic patterns; and
inputting the second magnetism to a first film magnetic input connected to the first film magnetic patterns.

6. The method of claim 5, further comprising:
forming second panel magnetic patterns extending in the first direction and disposed between the first panel magnetic patterns;
forming second film magnetic patterns extending in the first direction and disposed between the first film magnetic patterns;
inputting the second magnetism to a second panel magnetic input connected to the second panel magnetic patterns; and
inputting the first magnetism to a second film magnetic input connected to the second film magnetic patterns.

7. The method of claim 1, further comprising:
forming third panel magnetic patterns extending in a second direction intersecting the first direction on the substrate;
forming third film magnetic patterns extending in the second direction on the film;
inputting the first magnetism to the third panel magnetic patterns so that the third panel magnetic patterns have the first magnetic property;
inputting the second magnetism to the third film magnetic patterns so that the third film magnetic patterns have the second magnetic property; and
aligning the film on the substrate so that the third film magnetic patterns overlap the third panel magnetic patterns in a plan view.

8. The method of claim 7, further comprising:
forming fourth panel magnetic patterns extending in the second direction and disposed between the third panel magnetic patterns; and
forming fourth film magnetic patterns extending in the second direction and disposed between the third film magnetic patterns.

9. The method of claim 8, wherein the third panel magnetic patterns and the fourth panel magnetic patterns are irregularly disposed.

10. The method of claim 9, wherein the third film magnetic patterns are formed in areas to correspond to the third panel magnetic patterns in a plan view, and
wherein the fourth film magnetic patterns are formed in areas to correspond to the fourth panel magnetic patterns.

11. The method of claim 10, further comprising:
inputting the second magnetism to the fourth panel magnetic patterns so that the fourth panel magnetic patterns have the second magnetic property;
inputting the first magnetism o the fourth film magnetic patterns so that the fourth film magnetic patterns have the first magnetic property; and
aligning the film on the substrate so that the fourth film magnetic patterns overlap the fourth panel magnetic patterns in a plan view.

12. The method of claim 7, further comprising:
inputting the first magnetism to a first panel magnetic input connected to the first panel magnetic patterns and the third panel magnetic patterns; and
inputting the second magnetism to a first film magnetic input connected to the first film magnetic patterns and the third film magnetic patterns.

13. The method of claim 12, further comprising:
forming fourth panel magnetic patterns extending in the second direction and disposed between the third panel magnetic patterns;
forming fourth film magnetic patterns extending in the second direction and disposed between the third film magnetic patterns;
inputting the second magnetism to a second panel magnetic input connected to the second panel magnetic patterns and the fourth panel magnetic patterns; and
inputting the first magnetism to a second film magnetic input connected to the second film magnetic patterns and the fourth film magnetic patterns.

14. The method of claim 1, further comprising:
forming a conductor including a first end and a second end on the substrate;
forming a test current input in an area to correspond to the first end on the film; and
forming a test current output spaced apart from the test current input on the film in an area to correspond to the second end,
wherein, when the first film magnetic patterns contact the first panel magnetic patterns, the test current input contacts the first end, and the test current output contacts the second end, and
wherein a test current flows from the test current input to the test current output through the conductor.

15. The method of claim 1, wherein the inputting the first magnetism to the first panel magnetic patterns includes inputting the first magnetism to some of the first panel magnetic patterns among the first panel magnetic patterns, and
wherein the inputting the second magnetism to the first film magnetic patterns includes inputting the second magnetism to some of the first film magnetic patterns among the first film magnetic patterns.

16. The method of claim 1, wherein the first panel magnetic patterns are connected to each other, and
wherein the first film magnetic patterns are connected to each other.

17. A display device comprising:
a substrate including a display area and a non-display area disposed adjacent to the display area;
a display panel disposed on the substrate and overlapping the display area;
data pads disposed on the substrate and overlapping the non-display area;
first panel magnetic patterns disposed on the substrate, overlapping the non-display area, and connected to each other;
a film facing the substrate;
first film magnetic patterns disposed on the film, contacting the first panel magnetic patterns, and connected to each other;
second panel magnetic patterns disposed on the substrate, extending in the first direction, disposed between the first panel magnetic patterns, and connected to each other; and
second film magnetic patterns disposed on the second panel magnetic patterns, extending in the first direction, contacting the second panel magnetic patterns, and connected to each other.

18. The display device of claim 17, wherein the data pads, the first panel magnetic patterns, and the first film magnetic patterns extend in a first direction.

* * * * *